(12) United States Patent
Miura (10) Patent No.: US 9,184,005 B2
(45) Date of Patent: Nov. 10, 2015

(54) POWER SUPPLY RELAY CONTROLLER AND ELECTRIC POWER STEERING APPARATUS

(71) Applicant: NSK Ltd., Tokyo (JP)

(72) Inventor: Tomohiro Miura, Gunma (JP)

(73) Assignee: NSK Ltd., Tokyo (JP)

( * ) Notice: Subject to any disclaimer, the term of this patent is extended or adjusted under 35 U.S.C. 154(b) by 0 days.

(21) Appl. No.: 14/395,530

(22) PCT Filed: Aug. 29, 2013

(86) PCT No.: PCT/JP2013/005120
§ 371 (c)(1),
(2) Date: Oct. 20, 2014

(87) PCT Pub. No.: WO2014/097509
PCT Pub. Date: Jun. 26, 2014

(65) Prior Publication Data
US 2015/0115740 A1    Apr. 30, 2015

(30) Foreign Application Priority Data

Dec. 18, 2012   (JP) .................................. 2012-275717

(51) Int. Cl.
*H01H 47/00*    (2006.01)
*H01H 1/62*    (2006.01)
*H01H 3/00*    (2006.01)

(52) U.S. Cl.
CPC ................. *H01H 47/00* (2013.01); *H01H 1/62* (2013.01); *H01H 47/002* (2013.01); *H01H 3/001* (2013.01)

(58) Field of Classification Search
None
See application file for complete search history.

(56) References Cited

U.S. PATENT DOCUMENTS

| | | | | |
|---|---|---|---|---|
| 5,502,609 A * | 3/1996 | Thomas et al. | ..................... | 361/6 |
| 6,002,559 A * | 12/1999 | Meyer | ................. | 361/6 |
| 7,573,360 B2 * | 8/2009 | Bryan et al. | ................... | 335/201 |
| 8,401,738 B2 * | 3/2013 | Nakai | ............... | 701/42 |
| 8,513,953 B2 * | 8/2013 | Myoen et al. | .................. | 324/538 |
| 9,093,885 B2 * | 7/2015 | Song | | |

(Continued)

FOREIGN PATENT DOCUMENTS

| | | |
|---|---|---|
| JP | 3-37055 U | 4/1991 |
| JP | 2007-18927 A | 1/2007 |

(Continued)

OTHER PUBLICATIONS

International Search Report (PCT/ISA/210) dated Nov. 26, 2013, including English Translation (four (4) pages).

(Continued)

*Primary Examiner* — Rexford Barnie
*Assistant Examiner* — David Shiao
(74) *Attorney, Agent, or Firm* — Crowell & Moring LLP (57) ABSTRACT

To provide a power supply relay controller and an electric power steering apparatus capable of appropriately preventing contact failure of relays. When abnormal conduction between relay contacts occurs, a power supply relay circuit is opened and closed while a predetermined potential difference is applied between the relay contacts. At this time, an operation for turning on the relay contacts is performed while the charge of an electrolytic capacitor by a precharge circuit is limited. In this way, an ice layer between the relay contacts is removed by thermal energy of an arc that is generated between the contacts by a potential difference between the relay contacts.

4 Claims, 5 Drawing Sheets

(56) References Cited

U.S. PATENT DOCUMENTS

2010/0085060 A1* 4/2010 Ichikawa et al. ............ 324/503
2012/0234060 A1* 9/2012 Kato ............................. 70/210

FOREIGN PATENT DOCUMENTS

JP    2007-165406 A    6/2007
JP    2007-276552 A   10/2007

OTHER PUBLICATIONS

Written Opinion (PCT/ISA/237) dated Nov. 26, 2013, (three (3) pages).
International Preliminary Report on Patentability (PCT/IPEA/409) dated Apr. 2, 2014, including English Translation (fifteen (15) pages).

* cited by examiner

POWER SUPPLY RELAY CONTROLLER AND ELECTRIC POWER STEERING APPARATUS

TECHNICAL FIELD

The present invention relates to a power supply relay controller for controlling a relay arranged between a power supply and an actuator circuit to which power is supplied from the power supply, and an electric power steering apparatus including the power supply relay controller.

BACKGROUND ART

In an electric power steering apparatus, mechanical relays are generally mounted on a power supply line and a motor line for the purpose of failsafe. Hermetically sealed relays are widely used as these relays in order to prevent the ingress of moisture, which causes the freezing of contacts during time in a low-temperature environment, as much as possible.

Further, since the relays have been also further miniaturized by demands on the miniaturization with high output of a system, the internal volume of the relays tends to be reduced. Meanwhile, a resin is generally used as a material of a case used for the relay. For this reason, if the relay is left under a high-temperature and high-humidity environment for a long time, the resin absorbs moisture in the air even though airtightness of the relay is ensured. Accordingly, relative humidity in the relay significantly increases particularly in the relay having a small internal volume. As a result, dew condensation is likely to occur on relay contacts.

In addition, a method of directly mounting a relay on a metal substrate and soldering the relay by use of a reflow oven is employed for the purpose of the improvement of heat dissipation. Since the cooling rate of the relay is high when the relay is mounted on a metal substrate as described above, moisture present in the relay is frozen under the low-temperature environment. Therefore, contact failure of relay contacts caused by the freezing of the contacts in likely to occur.

Accordingly, a technique for preventing the contact failure of the relay contacts is disclosed in, for example, PTL 1. In this technique, a foreign substance such as ice adhering to the relay contacts is removed by the repetition of an operation of turning on/off the relay. In addition, another technique disclosed in, for example, PTL 2. This technique is to generate vibration at a portion where freezing occurs and to release the freezing by this vibration.

CITATION LITERATURE

Patent Literature

PTL 1: JP 2007-276552 A
PTL 2: JP 2007-165406 A

SUMMARY OF INVENTION

Technical Problem

However, the technique disclosed in PTL 1 or 2 merely repeats the operation for turning on/off the relay or applies vibration in order to remove ice on the relay contact, therefore the ice sometimes is not removed reliably.

An object of the invention is to provide a power supply relay controller and an electric power steering apparatus that are capable of appropriately preventing contact failure of a relay.

Solution to Problem

In order to achieve the above-mentioned object, according to a first aspect of the invention, there is provided a power supply relay controller including: a relay control unit configured to control a power supply relay circuit inserted between a battery and an actuator circuit to which power is supplied from the battery; an anomaly detecting unit configured to detect abnormal conduction between relay contacts of the power supply relay circuit while the relay control unit outputs a relay on command for closing the relay contacts; and an abnormality processing unit configured to open and close the relay contacts while a predetermined potential difference is applied between the relay contacts, when the anomaly detecting unit detects the abnormal conduction between the relay contacts.

Accordingly, even though an ice layer is present between the relay contacts when the contacts are close to each other by the operation for turning on the relay, it is possible to remove the ice layer by the thermal energy of the arc generated between the contacts by a potential difference between the relay contacts. Therefore, it is possible to easily ensure conduction between the relay contacts.

Further, according to a second aspect, the power supply relay controller further include a capacitor coupled between ground and a contact out of the relay contacts of the power supply relay circuit, the contact being coupled to the actuator circuit; and a precharge circuit configured to charge the capacitor before the relay contacts are closed. When the anomaly detecting unit detects the abnormal conduction between the relay contacts, the abnormality processing unit opens and closes the relay contacts while an amount of charge in the capacitor charged by the precharge circuit is limited to be smaller compared to a normal case where the anomaly detecting unit does not detect the abnormal conduction between the relay contacts.

Since the amount of charge by the precharge circuit is limited to smaller compared to the normal case as described above, it is possible to apply a predetermined potential difference between the relay contacts. Further, generally, a precharge operation is necessarily performed before the power supply relay is turned on, and the potential difference is applied between the relay contacts by using the charge and discharge by the precharge circuit used in the precharge operation. Accordingly, it is possible to realize the above configuration by use of an existing component structure without adding special components or units.

Furthermore, according to a third aspect, the anomaly detecting unit detects the abnormal conduction between the relay contacts on the basis of an amount of electric charge that is charged in the capacitor while the relay control unit outputs the relay on command and the actuator circuit is driven.

As described above, the abnormal conduction is detected by using the loss of the electric charge of the capacitor when the actuator circuit is driven while the relay contacts do not conduct. Accordingly, it is possible to appropriately detect the abnormal conduction between the relay contacts.

Moreover, according to a fourth aspect, the anomaly detecting unit detects a potential difference between both ends of the capacitor as the amount of electric charge charged in the capacitor, and determines that the abnormal conduction occurs between the relay contacts when the potential difference obtained while the relay control unit outputs the relay on command and the actuator circuit is driven is equal to or lower than an abnormality voltage threshold.

As described above, the potential difference between the both ends of the capacitor obtained while the relay contacts are operated to be turned on and the actuator circuit is driven is compared with the preset abnormal voltage threshold. Accordingly, it is possible to appropriately detect the abnormal conduction between the relay contacts by a relatively simple structure.

In addition, according to a fifth aspect, the power supply relay controller may further include a temperature detecting unit configured to detect a temperature in the vicinity of the relay contacts. The anomaly detecting unit determines whether or not the abnormal conduction between the relay contacts occurs when the temperature detected by the temperature detecting unit is equal to or lower than a preset low-temperature environment determination temperature.

As described above, it is determined whether or not the abnormal conduction between the relay contacts occurs when the power supply relay circuit is exposed to a low-temperature environment. Accordingly, it is possible to prevent unnecessary checking for the abnormal conduction between the relay contacts.

According to another aspect of the invention, there is provided an electric power steering apparatus including: an electric motor configured to apply a steering assist force reducing a driver's steering load to a steering system; a battery; an actuator circuit as a motor drive circuit to which power is supplied from the battery, the motor drive circuit being configured to drive and control the electric motor; a power supply relay circuit inserted between the battery and the actuator circuit; and any one of the above power supply relay controllers.

Since a power supply relay reliably operating under the low-temperature environment can be used as described above, it is possible to obtain an electric power steering apparatus that performs stable steering assist control.

Advantageous Effects of Invention

In the power supply relay controller of the present invention, the relay contacts are opened and closed while a predetermined potential difference is applied between the relay contacts. Accordingly, it is possible to melt ice adhering to the relay contacts, by inducing arc discharge of the relay contacts. As described above, it is possible to reliably operate a power supply relay under the low-temperature environment without using special units.

Accordingly, it is possible to stably perform steering assist control in the electric power steering apparatus to which the power supply relay controller has been applied.

DESCRIPTION OF EMBODIMENTS

An embodiment of the invention will now be described with reference to the drawings.

(First Embodiment)

Figure 1:
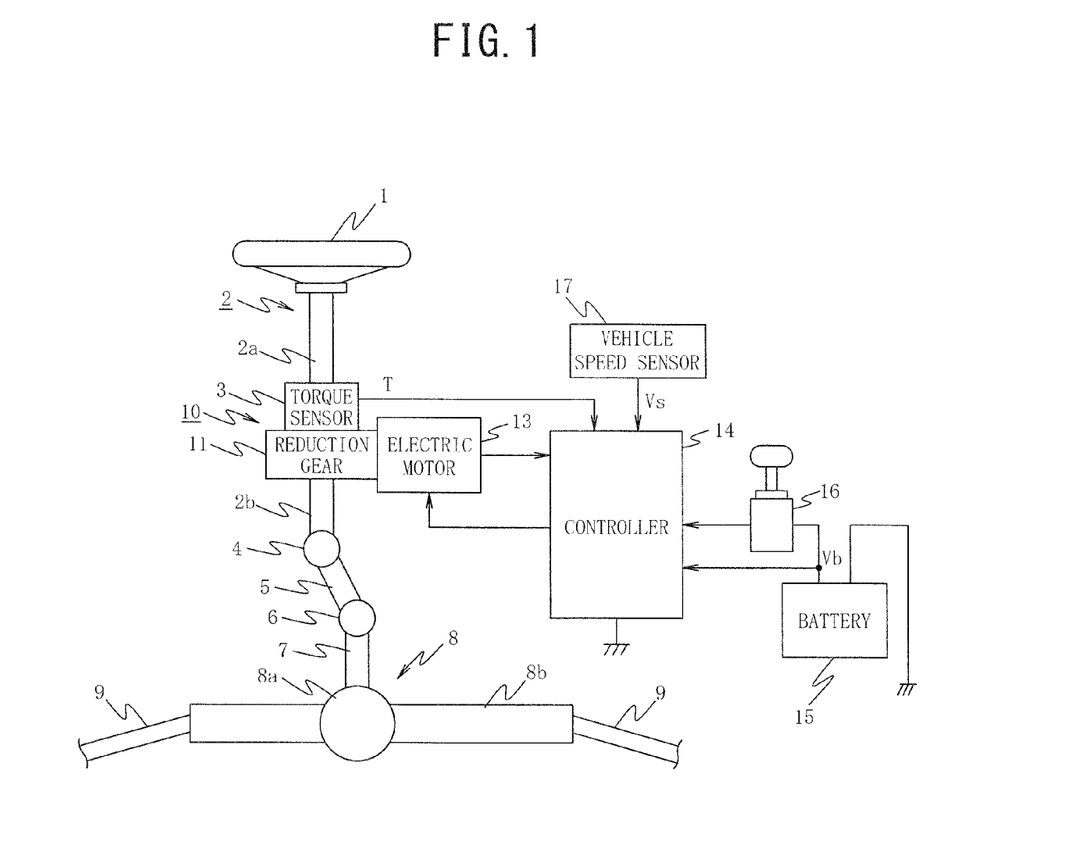
FIG. 1 is a view illustrating the entire configuration of an electric power steering apparatus according to the invention.

FIG. 1 is a view illustrating the entire configuration of an electric power steering apparatus according to the invention.

In FIG. 1, reference numeral 1 denotes a steering wheel. A steering effort applied to the steering wheel 1 by a driver is transmitted to a steering shaft 2 including an input shaft 2a and an output shaft 2b. One end of the input shaft 2a of the steering shaft 2 is linked to the steering wheel 1, and the other end of the input shaft 2a is linked to one end of the output shaft 2b via a steering torque sensor 3 as steering torque detecting means.

The steering force transmitted to the output shaft 2b is transmitted to an intermediate shaft 5 via a universal joint 4, and is further transmitted to a pinion shaft 7 via a universal joint 6. The steering effort transmitted to the pinion shaft 7 is transmitted to tie rods 9 via a steering gear 8, and steers steered wheels, not illustrated. Here, the steering gear 8 employs a rack-and-pinion type including a pinion 8a linked to the pinion shaft 7 and a rack 8b engaging with the pinion 8a, and converts a rotational motion transmitted to the pinion 8a into a linear motion of the rack 8b.

A steering assist mechanism 10, which transmits a steering assist force to the output shaft 2b, is linked to the output shaft 2b of the steering shaft 2. The steering assist mechanism 10 includes a reduction gear 11 linked to the output shaft 2b, and an electric motor 13 constituted of a brush motor, electric motor 13 being linked to the reduction gear 11 and for generating a steering assist force for a steering system.

The steering torque sensor 3 detects steering torque applied to the steering wheel 1 and transmitted to the input shaft 2a. For example, the steering torque sensor 3 is configured to convert the steering torque into the torsional angular displacement of a torsion bar, not illustrated, inserted between the input shaft 2a and the output shaft 2b, to detect this torsional angular displacement as a magnetic signal, and to convert the magnetic signal into an electrical signal.

The steering torque sensor 3 detects the steering torque applied to the steering wheel 1 and transmitted to the input shaft 2a, and is configured to detect relative displacement (rotational displacement) between the input shaft 2a and the output shaft 2b linked to a torsion bar, not illustrated, as the change in the impedance of a coil pair corresponding the relative displacement. A torque detection value T, outputted from the steering torque sensor 3 is received by a controller 14.

Power is supplied to the controller 14 from a battery 15 (for example, 13 V) as a DC power supply, so that the controller 14 is operated. A negative electrode of the battery 15 is grounded. A positive electrode of the battery 15 is coupled to the controller 14 via an ignition switch 16 used for starting an engine, and is directly coupled to the controller 14 without interposing the ignition switch 16 therebetween.

A vehicle speed detection value Vs detected by a vehicle speed sensor 17 and the torque detection value T are received by the controller 14, and the controller 14 performs steering assist control for applying a steering assist force to the steering system on the basis of the torque detection value T and the vehicle speed detection value Vs. Specifically, the controller 14 calculates a steering assist torque command value, which is used to generate the steering assist force by the electric motor 13, by a well-known procedure, and performs the feedback control of a drive current to be supplied to the electric motor 13, on the basis of the calculated steering assist torque command value and a motor current detection value.

Figure 2:
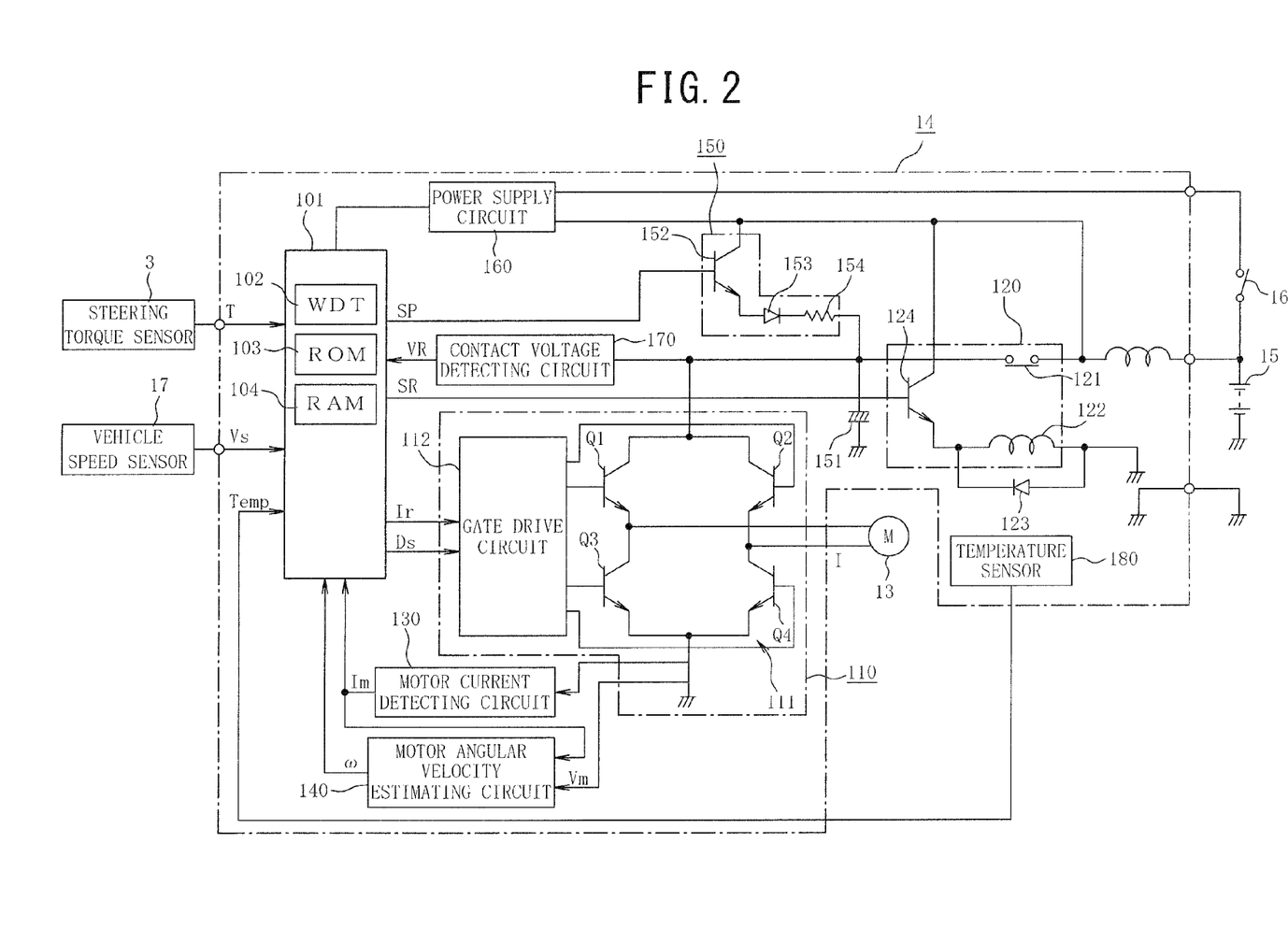
FIG. 2 is a block diagram illustrating the specific configuration of a controller.

As illustrated in FIG. 2, the controller 14 includes a micro control unit (hereinafter, referred to as a MCU) 101 that performs a predetermined calculation on the basis of the torque detection value T and the vehicle speed detection value Vs so as to output a motor drive signal Ir and a motor rotation-direction signal Ds. Further, the controller 14 includes a motor drive circuit 110 for driving the electric motor 13 on the basis of the motor drive signal Ir and the motor rotation-direction signal Ds outputted from the MCU 101, and a power supply relay circuit 120 inserted between the battery 15 and the motor drive circuit 110 so as to control the supply of power to the motor drive circuit 110 from the battery 15.

Here, for the purpose of the improvement of heat dissipation, the power supply relay circuit 120 is directly mounted on a metal substrate and is soldered by use of a reflow oven. The power supply relay circuit 120 is arranged in a resin case of which airtightness is ensured.

Moreover, the controller 14 includes a motor current detecting circuit 130 for detecting a motor current I, and a motor angular velocity estimating circuit 140 for estimating motor angular velocity ω on the basis of a motor terminal voltage Vm and a motor drive current (current detection value) Im detected by the motor current detecting circuit 130.

Further, the controller 14 includes a precharge circuit 150 that is coupled in parallel with the power supply relay circuit 120 and supplies a precharge voltage to the one of relay contacts 121 of the power supply relay circuit 120, the one of the relay contacts 121 being coupled to the motor drive circuit 110. Further, the controller 14 includes a power supply circuit 160 coupled to the battery 15 via the ignition switch 16 and for forming control power in the controller 14 at the time of startup, and a contact voltage detecting circuit 170 for detecting a contact voltage VR at the one of the relay contacts 121 of the power supply relay circuit 120, the one of the relay contacts 121 being coupled to the motor drive circuit 110.

Here, as illustrated in FIG. 2, the motor drive circuit 110 includes an H-bridge circuit 111 and a gate drive circuit 112. The H-bridge circuit 111 includes four NPN transistors Q1 to Q4 to which a battery voltage Vb of the battery 15 is inputted via the relay contacts 121 of the power supply relay circuit 120, and supplies the motor current I to the electric motor 13 so as to drive the electric motor 13 in a forward and a reverse directions. The gate drive circuit 112 drives and controls the respective transistors Q1 to Q4 of the H-bridge circuit 111.

The motor drive signal Ir and the motor rotation-direction signal Ds output from the MCU 101 to be described below are received by the gate drive circuit 112, and the gate drive circuit 112 rotationally drives the electric motor 13 on the basis of the torque detection value T and the vehicle speed detection value Vs by driving and controlling the diagonal transistors Q1 and Q4 or the diagonal transistors Q2 and Q3 on the basis of the motor drive signal Ir and the motor rotation-direction signal Ds.

Further, the power supply relay circuit 120 includes another of the relay contacts 121 normally opened and a relay coil 122 for opening and closing the relay contacts 121, the another of the relay contacts 121 being coupled to the battery 15. A surge absorbing diode 123 is connected in parallel with the relay coil 122. One end of the relay coil 122 is coupled to the battery 15 via an NPN transistor 124 as a switching element, and the other end of the relay coil 122 is grounded.

Furthermore, the precharge circuit 150 includes an electrolytic capacitor 151 and a series circuit. The electrolytic capacitor 151 is inserted between the ground and the one of the relay contacts of the power supply relay circuit 120, the one of the relay contacts being couple to the motor drive circuit 110. The series circuit includes an NPN transistor 152 as a switching element, a backflow prevention diode 153, and a precharge resistor 154, the switching element being coupled between a connection point and the another of the relay contacts 121, the connection point being present between the electrolytic capacitor 151 and the one of the relay contacts 121, the another of the relay contacts 121 being coupled to the battery 15.

The transistor 124 of the power supply relay circuit 120 is driven and controlled by a relay drive signal (a relay on command/a relay off command) SR formed by the MCU 101. Further, the transistor 152 of the precharge circuit 150 is driven and controlled by a pulse width modulation signal SP that is formed by the MCU 101.

Next, the configuration of the MCU 101 will be described.

The MCU 101 includes a watchdog timer (WDT) 102 for monitoring the program runaway of the MCU 101. Further, the MCU 101 generates the motor drive signal Ir on the basis of the torque detection value T, the vehicle speed detection value Vs, and the current detection value Im, and inputs the motor drive signal Ir to the motor drive circuit 110.

Furthermore, the MCU 101 includes a ROM (Read Only Memory) 103 and a RAM (Random Access Memory) 104 as illustrated in FIG. 2. A steering assist control processing program, an anomaly detecting processing program, and the like are stored in the ROM 103. Detection data, such as the torque detection value T and the motor drive current Im, or data required during the steering assist control process and the precharge drive process performed by the MCU 101 and processing results are stored in the RAM 104.

Further, when the ignition switch 16 is turned on and the battery voltage Vb is supplied to the MCU 101 from the battery 15, the MCU 101 performs precharge drive process and steering assist control process.

In the precharge drive process, when a predetermined time has passed after the start of the process, the outputting of the pulse width modulation signal SP to the transistor 152 of the precharge circuit 150 is started, the pulse width modulation signal SP having a predetermined relatively low frequency at which the precharge resistor 154 can be a minimum required resistance value. Accordingly, the transistor 152 is turned on or off, and the electrolytic capacitor 151 is charged with an electric charge on the basis of the battery voltage Vb. Then, when a further predetermined time has passed, the MCU 101 outputs a high-level relay drive signal (relay on command) SR to the switching element 124 of the power supply relay circuit 120 and stops the outputting of the pulse width modulation signal SP to the precharge circuit 150. As described above, the MCU 101 performs the precharge drive process of charging the electrolytic capacitor 151 before closing the relay contacts 121. Further, the MCU 101 performs the steering assist control process after terminating the precharge drive process and closing the relay contacts 121.

Furthermore, when a temperature (temperature detection value Temp) in the vicinity of the power supply relay circuit 120 detected by the temperature sensor 180, is received by the MCU 101 and the MCU 101 determines that the power supply relay circuit 120 is exposed to a low-temperature environment, the MCU 101 performs a process for the low-temperature environment of preventing the relay contacts 121 from being frozen. Here, the temperature sensor 180 is arranged on a metal substrate on which the power supply relay circuit 120 is mounted.

Figure 3:
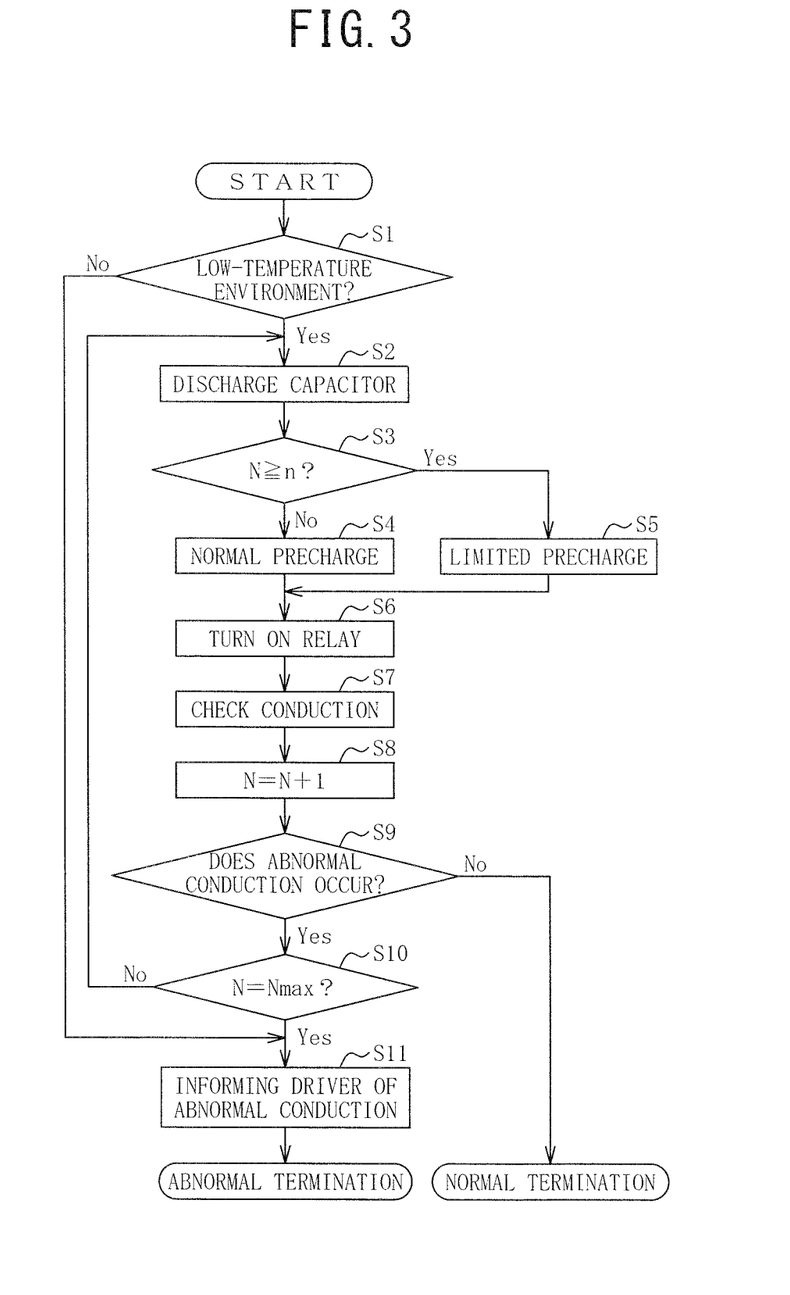
FIG. 3 is a flowchart illustrating a process for a low-temperature environment performed by a MCU.

FIG. 3 is a flowchart illustrating the process for the low-temperature environment performed by the MCU 101 when the abnormal relay conduction is detected.

First, in Step S1, the MCU 101 determines whether or not the temperature detection value Temp of the temperature sensor 180 is equal to or lower than preset low temperature determination temperature. Here, the low temperature determination temperature is set to a temperature where moisture present in the power supply relay circuit 120 is likely to be frozen. Further, if the temperature detection value Temp is equal to or lower than the low temperature determination temperature, the MCU 101 determines that the power supply relay circuit 120 is exposed to a low-temperature environment and the process goes to Step S2. If the temperature detection value Temp is higher than the low temperature determination temperature, the MCU 101 determines that the abnormal conduction caused by freezing does not occur in the relay contacts 121 and terminates the process for the low-temperature environment without any further operation.

In Step S2, the MCU 101 discharges the electrolytic capacitor 151. That is, the MCU 101 outputs the relay drive signal (relay off command) SR for opening the relay contacts 121, and drives the motor drive circuit 110.

Next, in Step S3, the MCU 101 determines whether or not the number N of times of retry operations of a process during conduction abnormality for ensuring the conduction of the relay contacts 121 is equal to or larger than a preset number n. If "N<n" is satisfied, the process goes to Step S4. If "N≥n" is satisfied, the process goes to Step S5 to be described below. It is noted that an initial value of the number N of times of retry operations is 0.

In Step S4, the MCU 101 starts an operation for charging the electrolytic capacitor 151 by the precharge circuit 150, and sets a charging voltage of the electrolytic capacitor 151 to a voltage VR1 lower than the battery voltage Vb by a predetermined voltage (for example, 3.5 V), the charging voltage being used for determining a timing for closing the relay contacts 121. Then, the process goes to Step S6. The voltage VR1 is referred to as a normal relay on voltage in the following description.

Further, in Step S5, the MCU 101 starts an operation for charging the electrolytic capacitor 151 by the precharge circuit 150, sets a charging voltage of the electrolytic capacitor 151 to a voltage VR2 lower than the voltage VR1, the charging voltage is used for determining a timing for closing the relay contacts 121. Then, the process goes to Step S6. The voltage VR2 is referred to as a limited relay on voltage in the following description.

In Step S6, the MCU 101 closes the relay contacts 121 at a timing when the potential difference (corresponding to voltage VR) between the both ends of the electrolytic capacitor 151 reach the normal relay on voltage VR1 or the limited relay on voltage VR2 set in Step S4 or S5, the potential difference indicating the amount of the electric charge of the electrolytic capacitor 151.

Next, in Step S7, the MCU 101 stops the output of the pulse width modulation signal SP so as to terminate the operation for charging the electrolytic capacitor 151 by the precharge circuit 150, and drives the motor drive circuit 110 (forced drive).

In Step S8, the MCU 101 increments the numbers N of times of retry operations, and determines whether or not the abnormal conduction occurs in the relay contacts 121 in Step S9. Here, the MCU 101 confirms the voltage VR. If the voltage VR is equal to or lower than a preset abnormal voltage threshold, the MCU 101 determines that the abnormal conduction of the relay contacts 121 occurs and the process goes to Step S10. On the other hand, if the voltage VR is not lowered, the MCU 101 determines that the relay contacts 121 are normally conducting and terminates the process for the low-temperature environment without any further operation (normal termination).

In Step S10, the MCU 101 determines whether or not the number N of times of retry operations reaches an upper limit number Nmax. If "N<Nmax" is satisfied, the process goes to Step S2. If "N=Nmax" is satisfied, the process goes to Step S11.

In Step S11, the MCU 101 determines that the abnormal conduction of the relay contacts 121 is not eliminated even though the retry operation is performed the number Nmax of times, and terminates the process for the low-temperature environment after informing a driver of the abnormal conduction of the relay contacts 121 (abnormal termination).

Meanwhile, the motor drive circuit 110 of FIG. 2 corresponds to an actuator circuit, the MCU 101 and the transistor 124 correspond to a relay control unit, and the temperature sensor 180 corresponds to a temperature detecting unit. Further, in FIG. 3, Steps S5 and S6 correspond to an abnormality processing unit and Steps S7 and S9 correspond to an anomaly detecting unit.

Next, the operation of this embodiment will be described.

When a driver turns on the ignition switch 16, control power is supplied to the controller 14 from the power supply circuit 160, and thus the MCU 101 is operated by the control power. At this time, the MCU 101 performs the precharge drive process and the steering assist control process.

In the precharge drive process, first, the outputting of the pulse width modulation signal SP to the NTN transistor 152 of the precharge circuit 150 is started, the pulse width modulation signal SP having a relatively low frequency at which the precharge resistor 154 can be the minimum resistance value. When the pulse width modulation signal SP is supplied to the gate of the NTN transistor 152 of the precharge circuit 150, the NTN transistor 152 is repeatedly turned on and off, so that the electrolytic capacitor 151 is charged with the electric charge on the basis of the battery voltage Vb.

Accordingly, the contact voltage VR at the one of the relay contacts of the power supply relay circuit 120, the one of the relay contacts being coupled to the motor drive circuit, is gradually increased, and is increased up to a precharge voltage VP slightly lower than the battery voltage Vb determined relative to the battery voltage Vb depending on the frequency of the pulse width modulation signal SP and the resistance value of the precharge resistor 154. The contact voltage VR at the one of the relay contacts coupled to the motor drive circuit is maintained as it is after reaching the precharge voltage VP.

After that, when the MCU 101 outputs a high-level relay drive signal (relay on command) SR to the NTN transistor 124 of the power supply relay circuit 120, current flows in the relay coil 122 from the battery 15. Accordingly, the relay coil 122 is energized to close the relay contacts 121.

Therefore, the battery voltage Vb is supplied to the motor drive circuit 110 via the relay contacts 121 of the power supply relay circuit 120. Accordingly, the motor drive circuit 110 becomes operable. At this time, since a potential difference between the battery voltage Vb at the another of the relay contacts 121 coupled to the battery 15 and the precharge voltage VP at the one of the relay contacts 121 coupled to the motor drive circuit 110 is small, it is possible to suppress inrush current flowing into the electrolytic capacitor 151 through the relay contacts 121 to a small value. Accordingly, it is possible to reliably prevent the contact welding of the relay contacts 121.

Therefore, it is possible to reliably suppress the inrush current flowing through the relay contacts 121 of the power supply relay circuit 120, by reducing a potential difference between the both ends of the relay contacts 121 of the power supply relay circuit 120.

Further, when the precharge drive process is ended, the MCU 101 performs the steering assist control process. In the steering assist control process, a steering assist torque command value, which is used to generate the steering assist force by the electric motor 13, is calculated on the basis of the torque detection value T and the vehicle speed detection value Vs and the feedback control of drive current, which is supplied to the electric motor 13, is performed on the basis of the calculated steering assist torque command value and the motor current detection value. Accordingly, it is possible to perform the steering assist control that reduces a driver's steering load.

It is noted that the power supply relay circuit 120 of this embodiment is a hermetically sealed relay, and is arranged on a metal substrate to improve the heat dissipation of an electric component required for high output. Further, since the relay is miniaturized by using a resin case, a resin absorbs moisture under the high-temperature environment, and thus humidity in the relay is likely to increase. Furthermore, if the relay is mounted on the metal substrate, the cooling rate of the relay is also high, therefore, moisture present in the relay is likely to be frozen below the freezing point. If ice adheres to the relay contacts, the relay contacts do not conduct even though the relay contacts 121 are operated to be turned on, and thus the operation failure of the motor drive circuit 110 sometimes occurs.

Therefore, in this embodiment, for the purpose of the removal of an ice layer between the relay contacts when it is determined that temperature is low, an operation for turning on/off the relay is performed while a predetermined potential difference is applied between the relay contacts. The operation at this time will be described with reference to FIG. 4.

Figure 4:
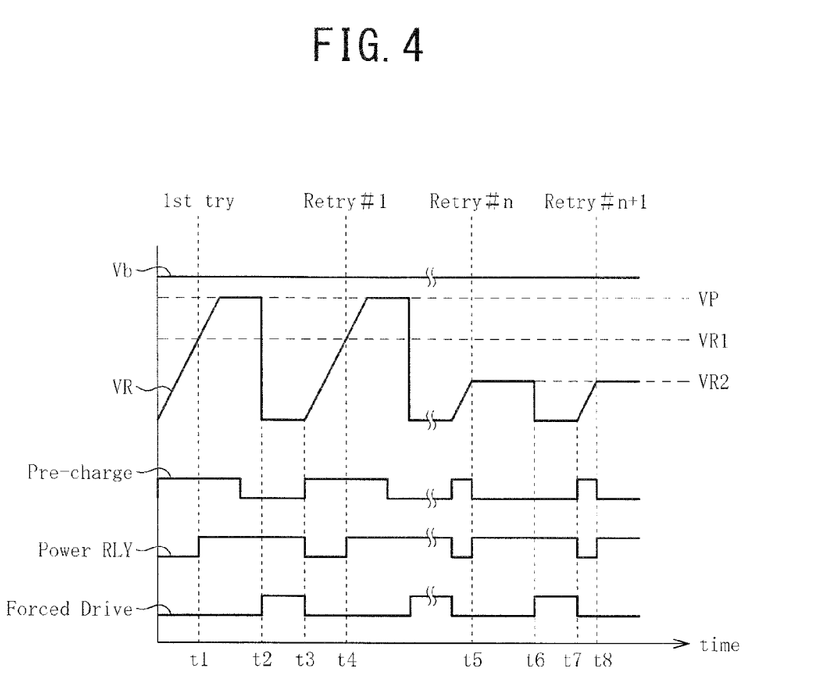
FIG. 4 is a time chart illustrating an operation of the process for the low-temperature environment.

First, the electrolytic capacitor 151 of the precharge circuit 150 is discharged, and the charge of the electrolytic capacitor 151 is started by the precharge circuit 150. Then, when the voltage VR reaches the normal relay on voltage VR1 at time t1, the relay contacts 121 are operated to be turned on and the charge of the electrolytic capacitor 151 performed by the precharge circuit 150 is terminated after the voltage VR reaches the precharge voltage VP. After that, at time t2, the motor drive circuit 110 is forcibly driven to check conduction. That is, the current necessary for power assist is supplied to the H-bridge circuit 111 from the battery 15 through the power supply relay circuit 120.

At this time, if ice adheres to the relay contacts 121, the relay contacts do not conduct even though the relay contacts 121 are operated to be turned on, so that it is not possible to supply the assist current to the H-bridge circuit 111. Therefore, the electric charge of the electrolytic capacitor 151 is lost at the time t2 in this case, and thus the voltage VR is lowered. It is possible to detect the abnormal conduction of the relay contacts 121 by confirming the voltage VR corresponding to the amount of the electric charge of the electrolytic capacitor 151 while the relay contacts 121 are operated to be turned on and the motor drive circuit 110 is driven.

If the abnormal conduction of the relay contacts 121 is detected, the charge of the electrolytic capacitor 151 performed by the precharge circuit 150 is started again at time t3. That is, at the time t3, the forced drive of the motor drive circuit 110 for checking conduction is terminated and the relay contacts 121 are operated to be turned off. Then, when the voltage VR reaches the normal relay on voltage VR1 at time t4, the relay contacts 121 are operated to be turned on. The first retry operation is performed in this manner.

After that, when ice adhering to the relay contacts 121 is not removed even though plural times (n−1 times) of retry operations are performed, the relay contacts 121 are turned on/off in the n-th retry operation in a state where a predetermined potential difference is applied between the relay contacts 121. Specifically, at time t5, the relay contacts 121 are operated to be turned on when the voltage VR reaches the limited relay on voltage VR2. At this time, the charge of the electrolytic capacitor 151 performed by the precharge circuit 150 is terminated at the time t5.

As described above, since the charging voltage of the electrolytic capacitor 151 is limited, it is possible to turn on the relay contacts 121 while a potential difference of (Vb−VR2) is applied between the relay contacts 121. An arc is generated between the relay contacts by the potential difference at this time so as to easily remove ice by the thermal energy of the arc.

If ice adhering to the relay contacts is not completely removed even at the n-th retry operation and the voltage VR is lowered when the forced drive of the motor drive circuit 110 for checking conduction is performed at time t6, the precharge circuit 150 starts the charge of the electrolytic capacitor 151 again at time t7 and the (n+1)-th retry operation is performed at time t8 at which the voltage VR reaches the limited relay on voltage VR2. This retry operation is repeatedly performed until the numbers of times of retry operations reaches the upper limit number Nmax.

Accordingly, it is possible to ensure the conduction of the relay contacts 121 by reliably removing ice that adheres to the relay contacts.

Figure 5A:
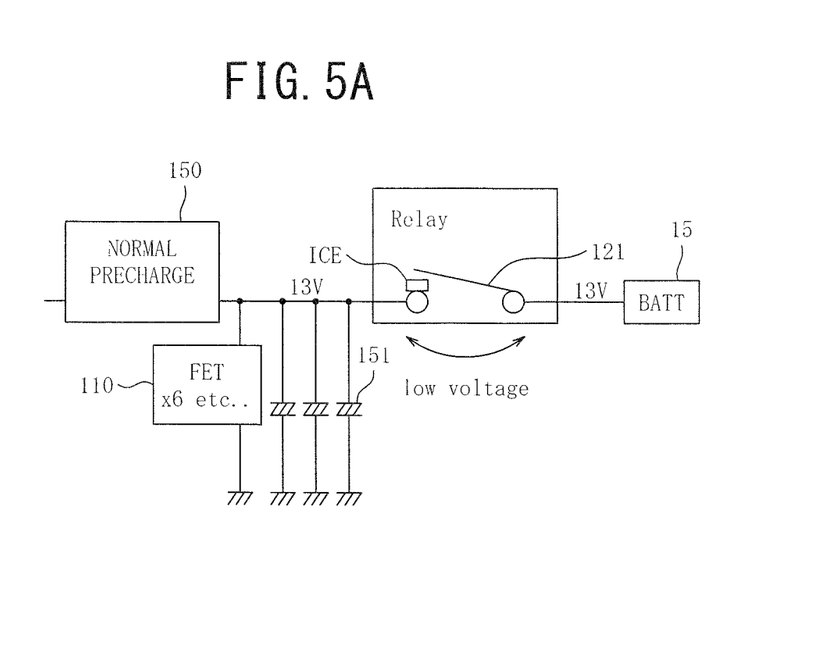
FIG. 5A is a view illustrating an effect of an embodiment when an electric charge is present in an electrolytic capacitor.

If normal precharge for charging the electrolytic capacitor 151 up to the precharge voltage VP, is performed as in the above-mentioned first retry operation (time t4), a potential difference between the relay contacts becomes (Vb−VP), that is, relatively small. For this reason, since an arc is not generated between the relay contacts even though an operation for turning on the relay contact 121 is performed in this state, it is not possible to melt ice (FIG. 5A).

Figure 5B:
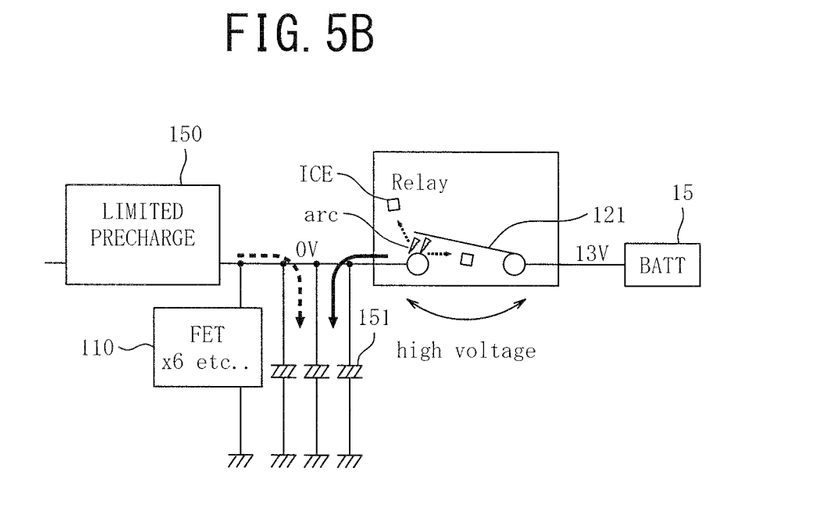
FIG. 5B is a view illustrating an effect of an embodiment when an electric charge is not present in an electrolytic capacitor.

In this embodiment, the charge of the electrolytic capacitor 151 is limited from the n-th retry operation (time t5) and an operation for turning on the relay contacts 121 is performed while a potential difference of (Vb−VR2) is applied between the relay contacts. Accordingly, even if the relay contacts 121 do not come into contact with each other due to the adhering ice when the relay contacts are close to each other, it is possible to melt ice by generated heat caused by the generation of an arc (FIG. 5B).

As described above, the arc discharge of the relay contacts 121 is induced by using the charge and discharge of the electrolytic capacitor 151 by the precharge circuit 150, so as to melt ice adhering to the contacts. Accordingly, it is possible to also reliably operate a relay arranged on the metal substrate, under the low-temperature environment without adding special components or units.

(Modification)

In the above-mentioned embodiment, a description is given focusing on a case in which checking of the conduction between the relay contacts 121 or the process during conduction abnormality is performed when it is determined that the current environment is a low-temperature environment on the basis of detection temperature Temp of the temperature sensor 180. However, the checking of the conduction between the relay contacts 121 or the process during conduction abnormality may be performed whenever the ignition switch 16 is turned on.

Further, the above-mentioned embodiment, a description is given focusing on a case in which a brush motor is used as the electric motor 13, but a brushless motor may be used as the electric motor 13.

Furthermore, the above-mentioned embodiment, a description is given focusing on a case in which the invention is applied to the power supply relay circuit 120 interposed between the battery 15 and the motor drive circuit 110, but an object to which the battery 15 supplies power is not limited to the motor drive circuit 110. That is, the invention is capable of being applied to other devices other than the electric power steering apparatus.

Industrial Applicability

According to the power supply relay controller of the invention, it is possible to reliably operate a power supply relay under the low-temperature environment without using special units. Accordingly, the power supply relay controller is useful.

Therefore, the electric power steering apparatus to which the power supply relay controller is applied can perform stable steering assist control, and thus is useful.

REFERENCE SIGNS LIST

1: steering wheel
2: steering shaft
3: steering torque sensor
8: steering gear
10: steering assist mechanism
13: electric motor
14: controller
15: battery
16: ignition switch
17: vehicle speed sensor
101: MCU
110: motor drive circuit
111: H-bridge circuit
112: gate drive circuit
120: power supply relay circuit
121: relay contact
122: relay coil
124: transistor
130: motor current detecting circuit
140: motor angular velocity estimating circuit
150: precharge circuit
151: electrolytic capacitor
152: transistor
154: precharge resistor
155: series circuit
160: power supply circuit
170: contact voltage detecting circuit
180: temperature sensor

The invention claimed is:

1. A power supply relay controller comprising:
a relay control unit configured to control a power supply relay circuit inserted between a battery and an actuator circuit to which power is supplied from the battery;
an anomaly detecting unit configured to detect abnormal conduction between relay contacts of the power supply relay circuit while the relay control unit outputs a relay on command for closing the relay contacts;
an abnormality processing unit configured to open and close the relay contacts while a predetermined potential difference is applied between the relay contacts, when the anomaly detecting unit detects the abnormal conduction between the relay contacts;
a capacitor coupled between ground and a contact out of the relay contacts of the power supply relay circuit, the contact being coupled to the actuator circuit; and
a precharge circuit configured to charge the capacitor before the relay contacts are closed,
wherein when the anomaly detecting unit detects the abnormal conduction between the relay contacts, the abnormality processing unit opens and closes the relay contacts while an amount of charge in the capacitor charged by the precharge circuit is limited to be smaller compared to a normal case where the anomaly detecting unit does not detect the abnormal conduction between the relay contacts.

2. The power supply relay controller according to claim 1, wherein the anomaly detecting unit detects the abnormal conduction between the relay contacts on the basis of an amount of electric charge that is charged in the capacitor while the relay control unit outputs the relay on command and the actuator circuit is driven.

3. The power supply relay controller according to claim 2, wherein the anomaly detecting unit detects a potential difference between both ends of the capacitor as the amount of electric charge charged in the capacitor, and determines that the abnormal conduction occurs between the relay contacts when the potential difference obtained while the relay control unit outputs the relay on command and the actuator circuit is driven is equal to or lower than an abnormality voltage threshold.

4. The power supply relay controller according to claim 1, further comprising:
a temperature detecting unit configured to detect a temperature in the vicinity of the relay contacts,
wherein the anomaly detecting unit starts processing for determining whether or not abnormal conduction between the relay contacts occurs when the temperature detected by the temperature detection unit is equal to or lower than preset low-temperature environment determination temperature at which moisture present in the power supply relay circuit is likely to be frozen.

* * * * *